(12) United States Patent
Baik et al.

(10) Patent No.: US 6,861,210 B2
(45) Date of Patent: Mar. 1, 2005

(54) RESIST REMOVER COMPOSITION

(75) Inventors: Ji-Hum Baik, Kyungki-do (KR);
Chang-Il Oh, Seongnam (KR);
Chong-Soon Yoo, Kyungki-do (KR)

(73) Assignee: Dongjin Semichen Co., Ltd., Incheon (KR)

( * ) Notice: Subject to any disclaimer, the term of this patent is extended or adjusted under 35 U.S.C. 154(b) by 0 days.

(21) Appl. No.: 10/478,388

(22) PCT Filed: May 21, 2001

(86) PCT No.: PCT/KR01/00837

§ 371 (c)(1),
(2), (4) Date: Nov. 18, 2003

(87) PCT Pub. No.: WO02/095500

PCT Pub. Date: Nov. 28, 2002

(65) Prior Publication Data

US 2004/0152022 A1 Aug. 5, 2004

(51) Int. Cl.$^7$ ............................................. G03F 7/32
(52) U.S. Cl. ............................................. 430/331
(58) Field of Search ........................................ 430/331

(56) References Cited

U.S. PATENT DOCUMENTS

| 4,617,251 A | 10/1986 | Sizensky | 430/256 |
| 4,770,713 A | 9/1988 | Ward | 134/38 |
| 5,612,303 A | * 3/1997 | Takayanagi et al. | 510/174 |

FOREIGN PATENT DOCUMENTS

| DE | 3828513 A1 | 3/1990 | G03F/7/42 |
| EP | 1 016 699 A1 | 7/2000 | C09D/9/00 |
| JP | 63-208043 | 8/1988 | G03C/11/00 |
| JP | 63-231343 | 9/1988 | G03C/11/00 |
| JP | 64-042653 | 2/1989 | G03C/11/00 |
| JP | 04-124668 | 4/1992 | G03F/7/42 |
| JP | 04-289866 | 10/1992 | G03F/7/42 |
| JP | 04-350660 | 12/1992 | G03F/7/42 |
| JP | 05-281753 | 10/1993 | G03F/7/42 |
| JP | 06/184595 | 7/1994 | C11D/7/26 |
| JP | 06-249355 | 9/1994 | F16K/31/05 |
| JP | 06-266119 | 9/1994 | G03F/7/32 |
| JP | 07-069618 | 4/1995 | C01B/35/04 |
| JP | 08-123043 | 5/1996 | G03F/7/42 |
| JP | 08-262746 | 10/1996 | G03F/7/42 |
| JP | 09-096911 | 4/1997 | G03F/7/42 |
| JP | 09-152721 | 6/1997 | G03F/7/42 |

* cited by examiner

*Primary Examiner*—Hoa Van Le
(74) *Attorney, Agent, or Firm*—Baker Botts L.L.P.

(57) ABSTRACT

The present invention relates to a resist remover composition for removing resists during manufacturing processes of semiconductor devices such as integrated circuits, large scale integrated circuits and very large scale integrated circuits. The composition comprises a) 10 to 40 wt. % of water-soluble organic amine compound, b) 10 to 60 wt. % of water-soluble polar organic solvent, c) 10 to 30 wt. % of water, and d) 0.1 to 10 wt. % of organic phenol compound containing two or more hydroxyl groups, and it is characterized in that the water-soluble polar organic solvent is 2-hydroxyisobutyric acid methylester (HBM).

5 Claims, 2 Drawing Sheets

RESIST REMOVER COMPOSITION

BACKGROUND OF THE INVENTION (a) Field of the Invention

The present invention relates to a remover composition for removing resists during a manufacturing process of semiconductor devices such as integrated circuits (IC), large scale integrated circuits (LSI) and very large scale integrated circuits (VLSI). More particularly, the present invention relates to a resist remover composition which can easily and quickly remove resist film that is cured by dry etching, ashing and ion implantation processes that have been recently emphasized due to the miniaturization and integration of circuit patterns during photolithography, and photoresist film modified by metallic side-products etched from lower metal film materials during said processes, at a low temperature, and which can minimize the corrosion of lower metal wiring during the resist removal process.

(b) Description of the Related Art

Generally, manufacturing processes of semiconductor devices comprise lithography processes that comprise forming a resist pattern on a conductive layer formed on a semiconductor substrate, and then forming a conductive layer pattern using the pattern as a mask. The resist pattern used as a mask must be removed from the conductive layer with resist remover during the stripping process after the conductive layer pattern forming process. However, since in recent very large scale integrated circuit semiconductor manufacturing, a dry etching process for forming conductive layer patterns has been conducted, it becomes difficult to remove resists in a subsequent stripping process.

In a dry etching process which replaces a wet etching process using liquid-phase acids, the etching process is conducted using a gas-phase solid-phase reaction between plasma etching gases and layers such as the conductive layer. Dry etching forms the main-stream of recent etching processes, because it is easy to control and can obtain sharp patterns. However, since during a dry etching process, ions and radicals of plasma etching gases cause complex chemical reactions with the resist film on its surface and rapidly cure it, it becomes difficult to remove the resist. Examples of dry etching include reactive ion etching (RIE), which renders it difficult to remove resist in a reproducible manner using conventional resist removers.

Another process that makes the removal of resists difficult is an ion implantation process. This process is conducted to diffuse atoms such as phosphorous, arsenic, boron, etc., in order to allow conductivity in a specific area of a silicon wafer in manufacturing processes of semiconductor devices. During this process, ions are injected only into a silicon wafer area that is not covered by the resist pattern, and simultaneously the surface of the resist pattern used as a mask in the ion implantation process is modified by a chemical reaction between the surface and accelerated ion beams. Accordingly, after the ion implantation process, it becomes difficult to remove the resist film using various solvents in a stripping process.

A resist film that has undergone the above-mentioned dry etching process or ion implantation process cannot be sufficiently removed using conventional phenol resist remover, and even if removed, inferiority rates of semiconductor devices increase because high temperature of 100° C. or more and long immersion time are required, and thus the stripping process cannot be stably conducted. For this reason, phenol resist remover is presently seldom used at a manufacturing site.

Meanwhile, a recently suggested resist remover composition comprising alkanol amine and diethyleneglycol monoalkyl ether has been widely used because it has little odor and toxicity and exhibits effective removing performance for most resist films. However, it has also been found that said remover composition cannot sufficiently remove resist film exposed to plasma etching gases or ion beams in a dry etching process or an ion implantation process. Thus, there has been a need for the development of a novel resist remover that can remove resist film modified by the dry etching and ion implantation processes.

As stated above, it is difficult to remove resist film that has undergone the ion implantation process using resist remover. Particularly, it is more difficult to remove resist film that has undergone the ion implantation process with a high radiation dose for forming source/drain area in very large scale integrated circuit manufacturing process. During the ion implantation process, the surface of the resist film is cured mainly due to reaction heat from the high energy ion beams and the high radiation dose. In addition, popping of the resist occurs which generates resist residues. Commonly, a semiconductor wafer that is ashing-treated is heated to a high temperature of 200° C. or more. At this time, solvent remaining inside the resist should be evaporated and exhausted, which is not possible because a cured layer exists on the surface of the resist after the ion implantation process with a high radiation dose.

Accordingly, as ashing proceeds, internal pressure of the resist film increases and the surface of the resist film is ruptured by solvent remaining inside, which is referred to as popping. The surface cured layer dispersed by such popping becomes residues and they are difficult to remove. In addition, since the cured layer on the surface of the resist forms by heat, impurity ions, or dopants, are substituted in the structure of resist molecules to cause a cross-linking reaction, and the reacted area is oxidized by O2 plasma. Thus the oxidized resist changes into residues and particles to become contaminants, which lowers the production yield of very large scale integrated circuit manufacture.

Many dry and wet etching processes for effectively removing the resist cured layer have been suggested, one of which is a two step ashing method comprising conducting common ashing and following with a second ashing process as described in Fujimura, Japanese Spring Application Physical Society Announcement, 1P-13, p574, 1989. However, these dry etching processes are complicated, they require a lot of equipment and they lower production yield.

In addition, a resist remover composition comprising an organic amine compound and various organic solvents has been suggested as a resist remover used in a conventional wet stripping process. Specifically, a resist remover composition containing monoethanolamine (MEA) as the organic amine compound is widely used.

As examples, a two-component system resist stripper composition comprising a) organic amine compounds such as monoethanolamine (MEA), 2-(2-aminoethoxy)ethanol (AEE), etc., and b) polar solvents such as N,N-dimethylacetamide (DMAc), N,N-dimethylformamide (DMF), N-methylpyrrolidone (NMP), dimethylsulfoxide (DMSO), carbitol acetate, methoxyacetoxypropane, etc. (U.S. Pat. No. 4,617,251); a two-component system resist stripper composition comprising a) organic amine compounds such as monoethanolamine (MEA), monopropanolamine, methylamylethanol, etc., and b) amide solvents such as N-methylacetamide (Mac), N,N-dimethylacetamide (DMAc), N,N-dimethylformamide (DMF), N,N-dimethylpropionamide, N,N-diethylbutylamide, N-methyl-N-ethylpropionamide, etc. (U.S. Pat. No. 4,770,713); a two-component system resist stripper composition comprising a) organic amine compounds such as monoethanolamine (MEA), and b) non-protonic polar solvents such as 1,3-dimethyl-2-imidazolidinone (DMI), 1,3-dimethyl-tetrahydropyrimidinon, etc. (German Laid-Open Patent Application No. 3,828,513); a resist stripper composition comprising a) ethylene oxide-introduced alkylene polyamines of alkanol amines such as monoethanolamine (MEA), diethanol amine (DEA), triethanolamine (TEA), etc., and ethylenediamine, b) sulfone compounds such as sulforane, etc., and c) glycol monoalkyl ethers such as diethylene glycol monoethyl ether, diethylene glycol-monobutyl ether, etc., in a specific ratio (Japanese Laid-open Patent Publication No. Sho 62-49355); a resist stripper composition comprising a) water soluble amines such as monoethanolamine (MEA), diethanolamine (DEA), etc., and b) 1,3-dimethyl-2-imidazolidinone (Japanese Laid-open Patent Publication No. Sho 63-208043); a positive resist stripper composition comprising a) amines such as mono-ethanolamine (MEA), ethylenediamine, piperidine, benzyl amine, etc., b) polar solvents such as DMAC, NMP, DMSO, etc., and c) a surfactant (Japanese Laid-open Patent Publication No. Sho 63-231343); a positive resist stripper composition comprising a) nitrogen-containing organic hydroxy compounds such as monoethanolamine (MEA), b) one or more solvents selected from diethyleneglycol monoethyl ether, diethyleneglycol dialkyl ether, γ-butyrolactone and 1,3-dimethyl-2-imidazolinone, and c) DMSO in a specific ratio (Japanese Laid-open Patent Publication No. Sho 64-42653); a positive resist stripper composition comprising a) organic amine compounds such as monoethanolamine (MEA), etc., b) a non-protonic polar solvent such as diethylene glycol monoalkyl ether, DMAc, NMP, DMSO, etc., and c) a phosphate ester surfactant (Japanese Laid-open Patent Publication No. Hei 4-124668); a resist stripper composition comprising a) 1,3-dimethyl-2-imidazolidinone (DMI), b) dimethylsulfoxide (DMSO), and c) organic amine compounds such as monoethanolamine (MEA), etc. (Japanese Laid-open Patent Publication No. Hei 4-350660); and a resist stripper composition comprising a) monoethanolamine (MEA), b) DMSO, c) catechol (Japanese Laid-open Patent Publication NO. Hei 5-281753) have been suggested and these resist stripper compositions show relatively good properties in terms of their stabilities, process-abilities and resist removing performances.

However, one of the recent tendencies of semiconductor device manufacturing processes is treating various substrates including silicon wafers at a high temperature of 110 to 140° C., and thus resists are often baked at high temperatures. However, said resist strippers do not have sufficient capabilities for removing resists that are baked at high temperatures. As compositions for removing the hard baked resists, resist remover compositions containing water and/or hydroxylamine have been suggested. As examples, a resist stripper composition comprising a) hydroxylamines, b) alkanol amines, and c) water (Japanese Laid-open Patent Publication No. Hei 4-289866; a resist stripper composition comprising a) hydroxylamines, b) alkanol amines, c) water and d) anti-corrosives (Japanese Laid-open Patent Publication No. Hei 6-266119); a resist stripper composition comprising a) polar solvents such as GBL, DMF, DMAc, NMP, etc., b) aminoalcohols such as 2-methylaminoethanol, and c) water (Japanese Laid-open Patent Publication No. Hei 7-69618); a stripper composition comprising a) aminoalcohols such as monoethanolamine (MEA), b) water, and c) butyldiglycol (Japanese Laid-open Patent Publication No. Hei 8-123043); a resist stripper composition comprising a) alkanolamines, alkoxyamines, b) glycol monoalkyl ether, c) sugar alcohols, d) quaternary ammonium hydroxide, and e) water (Japanese Laid-open Patent Publication No. Hei 8-262746); a stripper composition comprising a) one or more alkanolamines of monoethanolamine (MEA) or AEE, b) hydroxylamine, c) diethyleneglycol monoalkyl ether, d) sugars (sorbitol), and e) water (Japanese Laid-open Patent Publication No. Hei 9-152721); a resist stripper composition comprising a) hydroxylamines, b) water, c) amines having an acid dissociation constant (pKa) of 7.5 to 13, d) water soluble organic solvent, and e) an anticorrosive (Japanese Laid-open Patent Publication No. Hei 9-96911) have been suggested.

However, said resist stripper compositions are not satisfactory in terms of either their removing performances for resist films cured by dry etching, ashing and ion implantation processes and those modified by metallic side-products etched from lower metal film materials during said processes, or anti-corrosive performances of lower metal wiring during the resist removal process.

SUMMARY OF THE INVENTION

It is an object of the present invention to provide a resist remover composition that can easily and quickly remove resist films cured by dry etching, ashing and ion implantation processes and those modified by metallic side-products etched from metal film materials during said processes at a low temperature, and which can minimize the corrosion of lower metal wiring.

In order to achieve these objects, the present invention provides a resist remover composition comprising a) 10 to 40 wt % of water-soluble organic amine compounds, b) 10 to 60 wt % of water-soluble polar organic solvent, c) 10 to 30 wt % of water, and d) 0.1 to 10 wt % of an organic phenol compound containing two or more hydroxyl groups, characterized in that said water-soluble polar organic solvent is 2-hydroxyisobutyric acid methylester (HBM).

In the resist remover composition according to the present invention, an amino alcohol compound is preferably used as the water-soluble organic amine compound, and the amino alcohol compound is selected from a group consisting of 2-amino-1-ethanol, 1-amino-2-propanol, 2-amino-1-propanol, 3-amino-1-propanol, 2-amino-1-butanol, 4-amino-1-butanol and a mixture thereof.

The b) water-soluble polar organic solvent may further comprise one or more compounds selected from a group consisting of dimethylsulfoxide (DMSO), N-methylpyrrolidone (NMP), dimethylacetamide (DMAc), dimethylformaide (DMF), dimethylimidazolinoe (DMI) and aliphatic carboxylic acid ester.

In addition, the aliphatic carboxylic acid ester is preferably selected from a group consisting of β-methoxy isobutyric acid methylester (HBM), 2-hydroxypropionic acid isopentyl ester, 2-hydroxypropionic acid butyl ester, ethyl-3-ethoxypropionate (EEP), methyl-3-methoxypropionate (MMP), ethyl-2-hydroxy propanate, butyl-2-hydroxy propanoate and a mixture thereof.

The phenol compound containing two or more of hydroxyl groups is selected from a group consisting of the compounds represented by the following formulae 1 to 5:

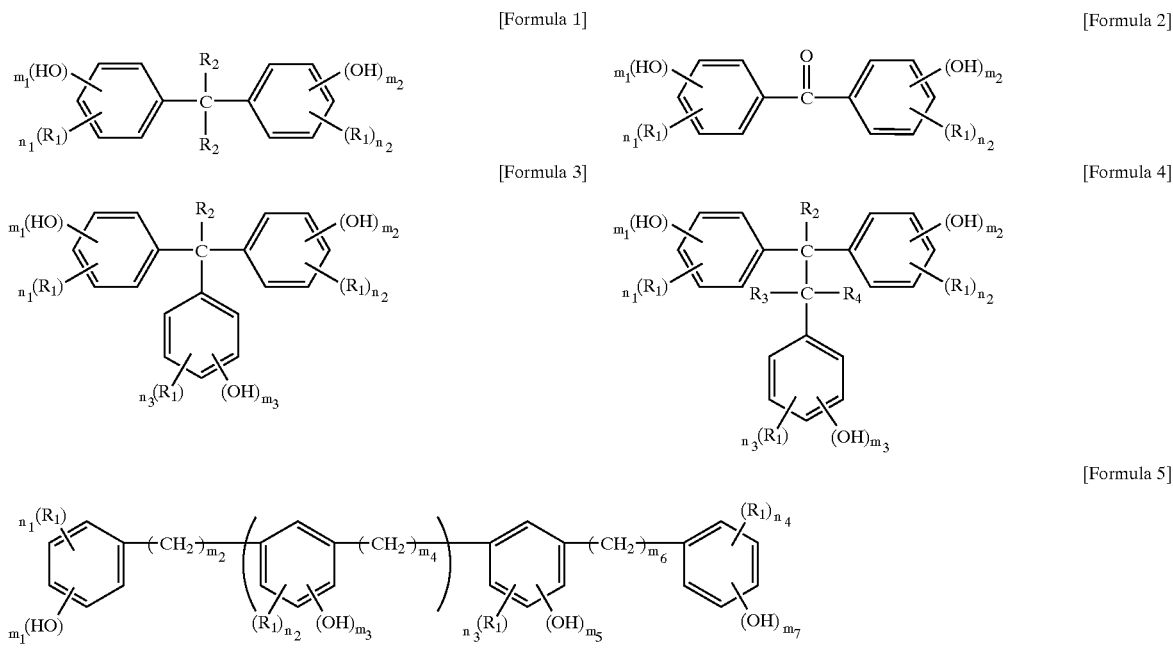

In the Formulae 1 to 5, $R_1$, which may be the same or different, is a C1–4 alkyl or C1–4 alkoxy group; $R_2$, which may be the same or different, is hydrogen, a C1–4 alkyl group, or a C1–4 alkoxy group; $R_3$ and $R_4$, which may be the same or different, are a C1–4 alkyl or C1–4 alkoxy group; k is an integers of 1 to 3; $m_1$ to $m_7$ are integers of 1 to 3; and $n_1$ to $n_4$ are integer of 0 to 3. Preferably, $R_1$ is a C1–4 alkyl group, $R_2$ to $R_4$ are C1–4 alkyl groups, k and $m_1$ to $m_7$ are 1, and $n_1$ to $n_4$ are 0 or 1.

The resist remover composition according to the present invention can easily and quickly remove resist film that is cured by dry etching, ashing and ion implantation processes and those modified by metallic side-products etched from lower metal film materials during said processes at a low temperature. In addition, it can minimize the corrosion of lower metal wiring, particularly side pitting during the resist removal process, and it decreases the phenomenon in which resists dissolved in resist remover are extracted to redeposit on the surface of a substrate. In addition, it can be rinsed with water without a need to use organic solvents such as isopropylalcohol and dimethylsulfoxide in a subsequent rinsing process.

DETAILED DESCRIPTION AND THE PREFERRED EMBODIMENTS

Figure 1:
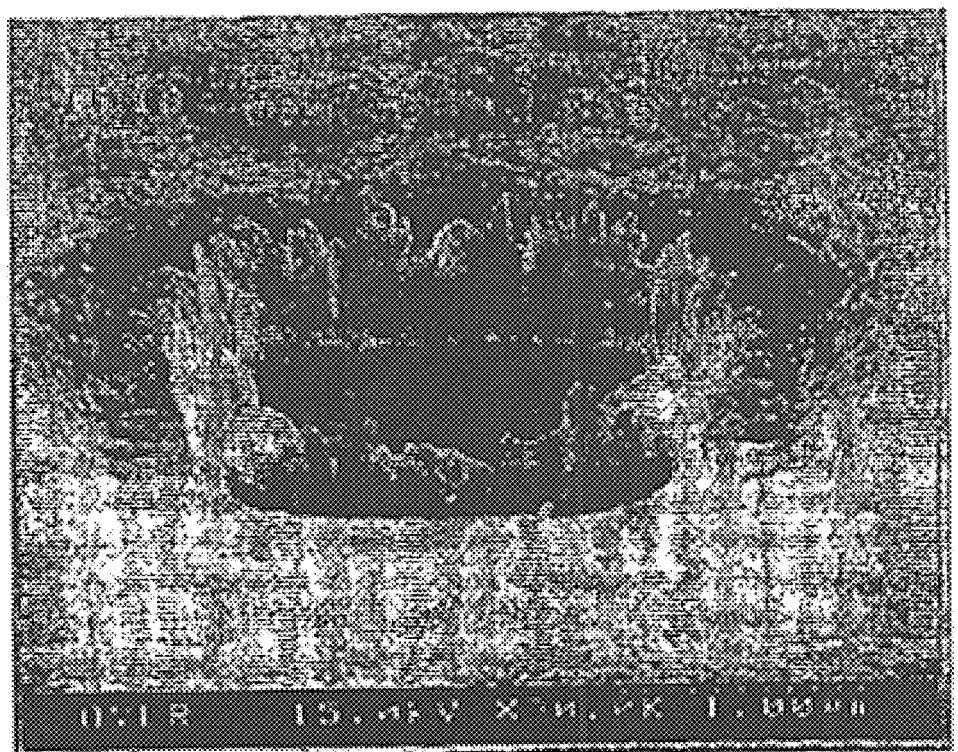
FIG. 1 shows Sample b-16 that has undergone a dry etching process for forming via holes (1) that function as electrical connection passages with a lower metal wiring pattern and an ashing process for removing most resists.
Figure 2:
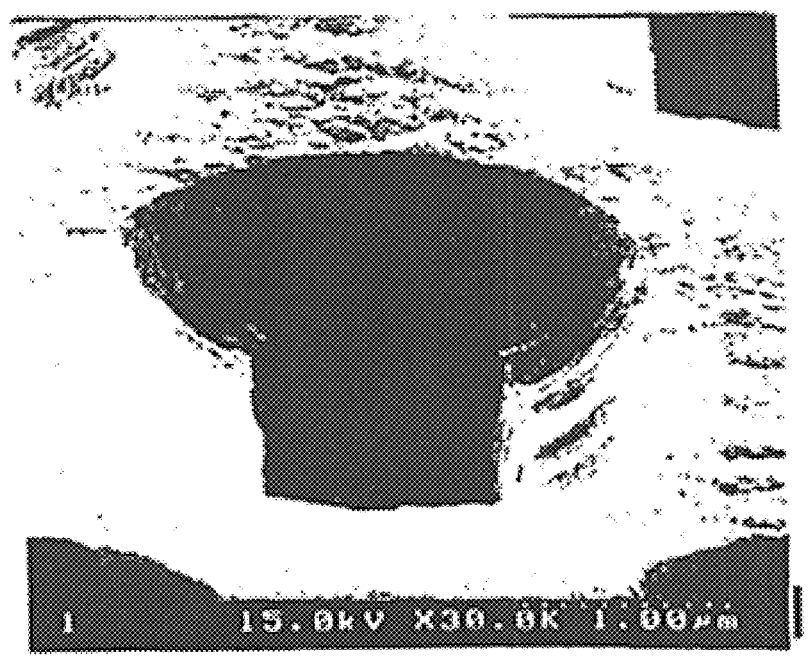
FIG. 2 is a SEM photo showing results of testing resist-removing performance using the resist remover composition of Example 10 at 50° C.
Figure 3:
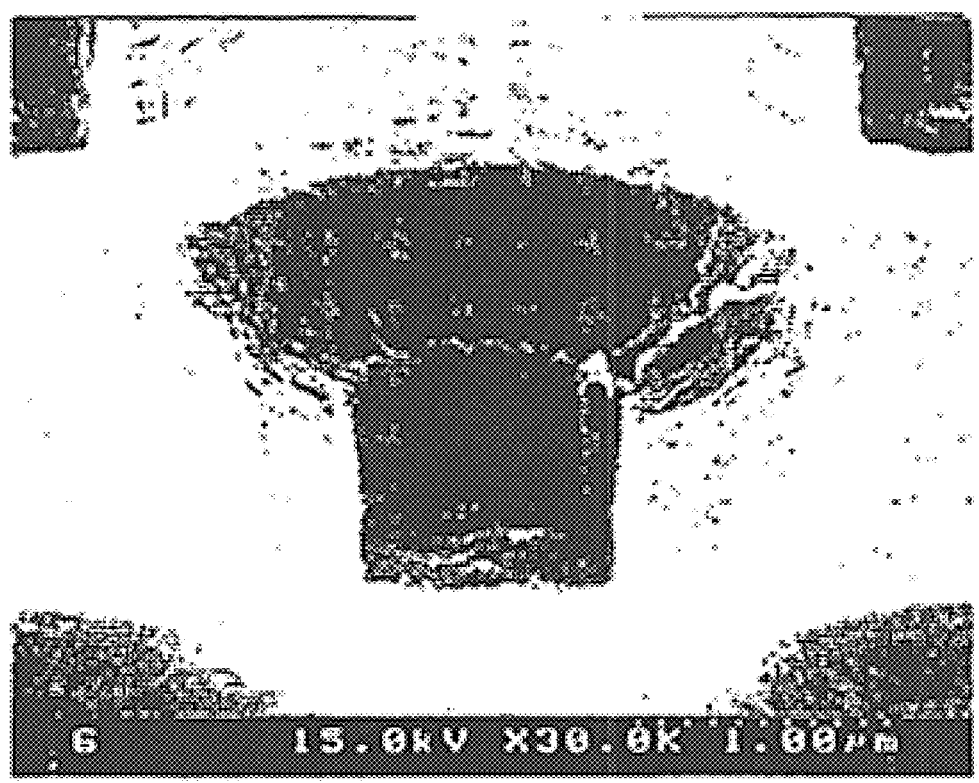
FIG. 3 is a SEM photo showing results of testing resist-removing performance using the resist remover composition of Comparative Example 7 at 50° C.

The present invention will be explained in more detail.

In the resist remover composition of the present invention, the a) water-soluble organic amine compounds are preferably amino alcohols. As examples, it is preferably selected from a group consisting of 2-amino-1-ethanol, 1-amino-2-propanol, 2-amino-propanol, 3-amino-1-propanol, 2-amino-1-butanol, 4-amino-1-butanol and a mixture thereof, and 2-amino-1-ethanol is most preferable from an industrial viewpoint considering resist removing performances and costs.

The content of the water-soluble organic amine compound is preferably 10 to 40 wt %, and more preferably 20 to 30 wt %. Specifically, if the content is less than 10 wt %, it will be difficult to completely remove resist modified by the preceding dry etching and/or ion implantation processes, and if the content exceeds 40 wt %, the corrosion of lower metal wiring film materials will be serious.

The b) water-soluble organic solvent is preferably 2-hydroxyisobutyric acid methylester (HBM). In addition, it may further comprise water-soluble polar organic solvents selected from a group consisting of dimethylsulfoxide (DMSO), N-methylpyrrolidone (NMP), dimethylacetamide (DMAc), dimethylformamide (DMF), dimethylimidazolidinone (DMI), aliphatic carboxylic acid ester and a mixture thereof.

The aliphatic carboxylic acid ester of the water soluble polar organic solvent is preferably selected from a group consisting of β-methoxy isobutyric acid methylester (MBM), 2-hydroxypropionic acid isopentylester, 2-hydroxypropionic acid butyl ester, etyl-3-ethoxypropionate (EEP), methyl-3-methyoxypropionate (MMP), ethyl-2-hydroxy propanate, butyl-2-hydroxy propanoate and a mixture thereof.

Specifically, the water-soluble polar organic solvent preferably has a dipole moment of 3.0 or more, and more preferably 4.0 or more. A dipole moment indicates polarity of a solvent, and a higher value means a higher polarity. The water-soluble polar organic solvents in Table 1 have dipole moments of 3.0 or more, and those having dipole moments of 4.0 or more include DMSO, NMP, DMI, etc. The higher the dipole moment of b), the better the resist removal performance and dissolving performance of the resist remover composition of the present invention.

The 2-hydroxyisobutyric acid methylester (HBM) is advantageously used as the b) water-soluble polar organic solvent, because it can be easily mixed with the a) water-soluble organic amine compound. As a result of studies, the present inventors have found that when amine is produced by the reaction of amino alcohol and the 2-hjydroxyisobutyric acid methyl ester (HBM), the strippabilities of the resists become different because of the reducing power of the produced amine. When amine is produced by the reaction between aliphatic carboxylic acid ester and amino alcohol, the strippability of the resist is excellent because the produced amine has good reducing power compared to organic polar solvents such as dimethylsulfoxide (DMSO), N-methylpyrrolidone (NMP), dimethylacetamide (DMAc), dimethylformamide (DMF), dimethylimidazolidinone (DMI), etc. Particularly, HBM allows most excellent strippability because it produces less side-products such as ethanol, etc. compared to the other aliphatic carboxylic acid esters.

In addition, the b) water-soluble polar organic solvent preferably has a boiling point of 150° C. or more, and more preferably 180° C. or more in terms of volatility. The water-soluble polar organic solvents of Table 1 that satisfy said requirement allow stable stripping performance of the resist remover composition because they have a very high affinity to water. In addition, they have advantages in that a rinsing process for removing the remover composition deposited on a substrate after the resist removal process can be proceeded with pure water instead of organic solvent. In addition, even if a trace amount of polar organic solvents remain, they do not adversely affect a semiconductor device since they have low corrosiveness on the metal conductive layer.

TABLE 1

|  | DMSO | NMP | DMI | DMF | DMAc |
|---|---|---|---|---|---|
| Dipole moment | 4.3 | 4.09 | 4.05 | 3.86 | 3.79 |
| Boiling point (° C.) | 189 | 202 | 225 | 153 | 166 |

The content of the b) water-soluble polar organic solvent is preferably 10 to 60 wt %, more preferably 20 to 50 wt %, and most preferably 25 to 45 wt %. Results of studies have confirmed that as the dipole moment of the water-soluble polar organic solvent increases, so does the resin solubility of the solvent on the resist composition, and it particularly has excellent solubility for unmodified resists that have undergone preceding processes. If the content of the water-soluble polar organic solvent is less than 20 wt %, the solubility for resists that have undergone dry processes such as etching or an ion implantation process will be lowered. On the other hand, the upper limit of the content of the water-soluble polar organic solvent of 50 wt % is set considering a compositional ratio with the other ingredients.

The c) water is preferably pure water filtered through an ion exchange resin, and more preferably deionized water having a resistivity of 18 MΩ or more.

The water content is preferably 10 to 30 wt %, and more preferably 15 to 25 wt %. If the water content is less than 10 wt %, the strippability for resists that have been seriously modified by metallic side-products generated after dry etching and ashing processes will decrease. However, if the water content exceeds 30 wt %, lower metal wiring may be corroded during the stripping process and the strippability for unmodified resists that comprise most of the resist will be decreased because the contents of the a) water-soluble organic amine compound and the b) water-soluble polar organic solvent will be decreased. Results of studies have confirmed that the water content is preferably 10 to 30 wt %.

In the resist remover composition of the present invention, the d) organic phenol compound containing two or more hydroxyl groups, which facilitates resist removal, is selected from a group consisting of compounds of the following formulae 1 to 5.

[Formula 1]

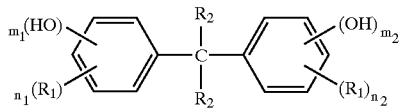

[Formula 2]

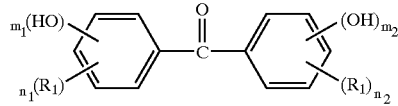

[Formula 3]

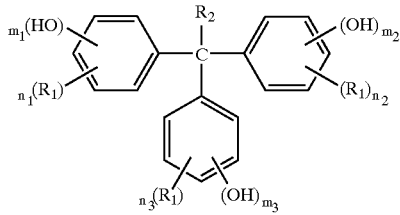

[Formula 4]

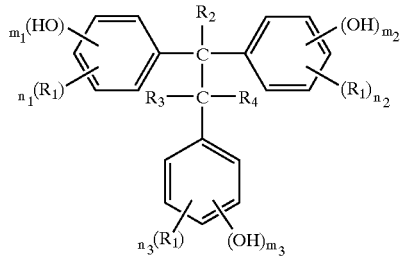

-continued

[Formula 5]

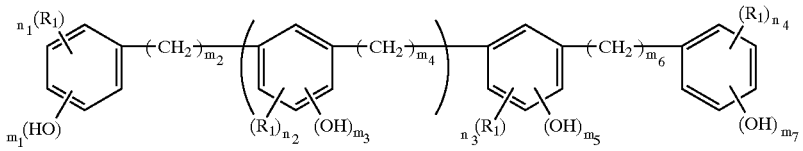

Wherein $R_1$, which may be the same or different, is a C1–4 alkyl or C1–4 alkoxy group; $R_2$, which may be the same or different, is a hydrogen atom, a C1–4 alkyl group, or a C1–4 alkoxy group; $R_3$ and $R_4$, which may be the same or different, are a C1–4 alkyl or C1–4 alkoxy group; k is an integer of 0 to 3; $m_1$ to $m_7$ are integers of 1 to 3; and n, to $n_4$ are integers of 0 to 3. Preferably, $R_1$ is a C1–4 alkyl group, $R_2$ to $R_4$ are C1–4 alkyl groups, k and $m_1$ to $m_7$ are 1, and $n_1$, to $n_4$ are 0 or 1.

As a result of many studies, it has been discovered that the organic phenol compound containing two or more hydroxyl groups remarkably improves resist removal performance at a low temperature compared to compounds having a hydroxyl group of less than two such as cresol, xylenol, and salicylic aldehyde. The examples of organic phenol compounds containing two or more hydroxyl groups include bisphenols such as 2,4'-methylenebisphenol, bisphenol A, bisphenol C, bisphenol E, bisphenol F, bisphenol AP, bisphenol M, bisphenol P, 1,1'-bis(4-hydroxylphenyl)cyclopentane, 9,9'-bis(4-hydroxyphenyl)fluorine, 1,1'-bis(5-methyl-2-hydroxylphenyl)methane, 3,5-dimethyl-4-hydroxybenzylphenol, 4,4'-hydroxylbenzophenone, etc.; tris phenols such as 1,1,1-(tris(4-hydroxyphenyl)methane, 1,1,1-tris(4-hydroxyphenyl)ethane, 1,1-bis(3-methyl-4-hydroxyphenyl)-1-(4-hydroxylphenyl)methane, 1,1-bis(2,5-dimethyl-4-hydroxyphenyl)1-(2-hydroxyphenyl)methane, 1,1-bis(3,5-methyl-4-hydroxyphenyl)-1-(2-hydroxyphenyl)methane, 2,6-bis(5-methyl-2-hydroxybenzyl)-4-methylphenol, 2,6-bis(3-methyl-4-hydroxybenzyl)-4-methylphenol, 2,6-bis(3,5-dimethyl-4-hydroxybenzyl)4-methylphenol, trisphenol-TC, etc.; tetrakis phenols such as 1,1,2,2-tetrakis(3-methyl-4-hydroxyphenyl)ethane, 1,1,3,3-tetrakis(4-hydroxyphenyl)propane, 1,1,5,5-tetrakis(4-hydroxyphenyl)pentane, α,α,α',α'-tetrakis(4-hydroxyphenyl)-3-xylene, α,α,α',α'-tetrakis(4-hydroxyphenyl)-4-xylene, α,α,α',α'-tetrakis(3-methyl-4-hydroxyphenyl)-3-xylene, α,α,α',α'-tetrakis(3-methyl-4-hydroxyphenyl)-4-xylene, etc.; hydroxybenzophenones such as 2,3,4-trihydroxybenzophenone, 2,4,4'-trihydroxybenzophenone, 2,3,4,4'-tetrahydroxybenzophenone, 2,2',3,3',4-pentahydroxybenzophenone, 2,2',3,3',4,4'-hexahydroxybenzophenone, etc.; 1-[1'-methyl-1'-(4'-hydroxyphenyl)ethyl]-4-[1',1'-bis-(4-hydroxyphenyl)ethyl]benzene, 2,6-bis(2'-hydroxy-5'-methylphenylethyl)-4-methyl-1-hydroxybenzene, etc.

The d) organic phenol compound containing two or more hydroxyl groups is essential for removing resist films cured by dry etching, ashing and ion implantation processes and those modified by metallic side-products etched from lower metal film materials during said processes, and effectively infiltrates hydroxide ions generated by the reaction between the water-soluble organic amine compound and hydrogen ions of water into a contact surface between the resist film and a semiconductor substrate. In addition, the d) organic phenol compound containing two or more hydroxyl groups prevents hydroxyl groups generated from the resist remover composition from corroding lower metal film materials.

In the resist remover composition of the present invention, the content of the d) organic phenol compound containing two or more hydroxyl groups is preferably 0.1 to 10 wt %, and more preferably 0.5 to 5 wt %. If the content of the compound is less than 0.1 wt %, the low temperature strippability for resist films that have been seriously modified by metallic side-products generated after dry etching and ion implantation processes will be decreased and the corrosion of lower metal film materials will become serious. If the content exceeds 10 wt %, the strippability for resist films will be uneconomical from an industrial viewpoint considering preparation costs.

Although the organic phenol compound containing two or more hydroxyl groups alone can facilitate anti-corrosive effects to the resist remover composition of the present invention, it cannot completely solve the pitting phenomenon, which is a partial erosion generated on the side or upper surface of the lower metal wiring film material. As a result of studies, it has been discovered that mixing triazole compounds with the organic phenol compound containing two or more hydroxyl groups can prevent the pitting. Particularly, it has been discovered that mixing a two-component system triazole compound comprising benzotriazole (BT) and tollyltriazole (TT) with the aromatic phenol compound containing hydroxyl groups in a suitable ratio would improve the effects of preventing side pitting that occurrs on the side-wall of resist film.

The resist remover composition of the present invention may further comprise benzotriazole (BT), tollyltriazole (TT), carboxylic benzotriazole (CBT) and a mixture thereof, among which a two-component system triazole compound comprising BT and TT is preferable.

The content of the triazole compound is preferably 0.5 to 5 wt %. If the content is less than 0.5 wt %, pitting-preventing performance will be insignificant, and if the content exceeds 5 wt %, the viscosity of the resist remover composition will increase and thus convenience during use will be lowered.

The resist remover composition of the present invention preferably comprises a silicon-type surfactant represented by the following formula 6.

[Formula 6]

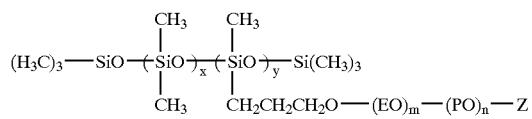

Wherein x is an integer of 0–10; y is an integer of 1–10; m is an integer of 0–10; n is an integer of 1–10; EO represents an ethyleneoxy group; PO represents a 1,2-propyleneoxy group; and Z represents a halogen atom or alkyl group.

The surfactant must be selected from those having sufficient solubility for a water-soluble organic amine compound, water-soluble polar organic solvent and water. As a result of studies, it has been discovered that the silicon type surfactant represented by the formula 6 is preferable in terms of a decrease in surface tension and prevention of photoresist redeposit. In addition, although a fluorine type surfactant widely used in conventional photoresist remover compositions can exhibit excellent surface-active effects when used in small amounts, it cannot be used in the resist remover composition of the present invention because it generates impurities or residues when dissolved in water and thus it has low solubility for the composition of the present invention.

However, since the silicon type surfactant represented by the formula 6 has high solubilities for water, water-soluble organic amine compounds and water-soluble polar organic solvent while exhibiting excellent surface-activating effects, it can achieve desired surface-activating effects without imposing the above problems. It also has excellent effects for preventing redeposit of photoresist, contrary to conventional polyethyleneglycol-type surfactants.

The redepositing of photoresist, which indicates a phenomenon in which the solid components of photoresist that have been dissolved in a photoresist remover composition are redeposited on a semiconductor substrate and become irremovable, when a semiconductor substrate is deposited in a photoresist remover composition that has been used for a long time, is one of the major causes for inferiority of photoresist removal.

The surfactant lowers the surface tension of the contact surface between lower metal film materials such as Al, dopped Si, Cu, Ti, W, etc. and the photoresist remover composition, thereby allowing the photoresist remover composition to penetrate deeply between micro-patterns of the conductive layer that is formed of lower metal film materials. Although such a function of the surfactant is insignificant when the size of the micro-pattern is comparatively large, it is more important as the micro-pattern becomes finer. And, this directly affects the production yield of semiconductor devices.

The content of the surfactant is preferably 0.01 to 1 wt %. If the content of the surfactant is less than 0.01 wt %, it will become difficult to remove metal oxides on the side part of micro-patterns and sufficient surface-activating effects cannot be achieved. If the content of the surfactant exceeds 1 wt %, photoresist redepositing-prevention effects will be lowered. Accordingly, in the photoresist remover composition of the present invention, the content of the silicon type surfactant is most preferably 0.01 to 1 wt %.

A method for removing resist film that has been used as a mask during the preceding photo-etching process using the resist remover composition of the present invention will now be explained.

The method for removing resist film from a substrate using the resist remover composition of the present invention comprises contacting a substrate on which a resist film is coated with the resist remover composition of the present invention by a conventional method. The contact can be made by immersing the substrate in the resist remover composition or by spraying the resist remover composition on the substrate. Other methods can be used.

In addition, the conventional resist remover composition can exhibit sufficient resist removal performance only if heated to a temperature of 80° C. or more, while the resist remover composition of the present invention can exhibit sufficient resist-removing performance at a relatively low temperature of 20 to 50° C. Therefore, the resist remover composition of the present invention can reduce the amount of evaporation (i.e., consumption) of remover composition and energy consumption during the resist removal process, and it can also reduce health problems of operators due to the evaporated organic solvents.

The resist remover composition of the present invention can be applied to a positive resist, a negative resist or a positive/negative double-use resist. As examples, it can be applied to a positive resist composition comprising novoalc phenol resin and a naphtoquinonediazide compound; a positive resist composition comprising a photo acid-producing agent which produces acid when light-exposed, compounds of which solubility increase in alkaline aqueous solutions when decomposed by acid and alkali-soluble resin; a positive resist composition comprising a photo acid-producing agent which produces acid when light-exposed and an alkali-soluble resin containing functional groups of which solubility increases in alkaline aqueous solutions when decomposed by acid; and a negative resist composition comprising a photo acid-producing agent which produces acid when light-exposed, a cross-linking agent and an alkali-soluble resin, among which the positive resist composition comprising novolac phenol resin and naphtoquinonediazide compound is particularly effective.

The present invention will now be explained in more detail with reference to the following Examples. However, the scope of the present invention is not limited thereto. In addition, unless specifically indicated, the % and mixing ratios are based on weight. The performance evaluation for the resist remover composition of Examples and Comparative Examples is conducted by the following method.

(1) Resist Removal Performance

Preparation of Sample a

On the surface of 5-inch silicon wafers on which aluminum film was deposited, a commonly used positive resist composition (Mitsubishi Company product, Product name: IS401) was spin-coated such that the final film thickness reached 1.6 μm. The silicon wafers were pre-baked at 100° C. for 90 seconds on a hot plate. Masks having a predetermined pattern were placed on the resist film, ultraviolet rays were irradiated thereto, and the resist film was developed at 21° C. for 60 seconds using tetramethylammonium hydroxide (TMAH) developer (Dongjin Chemical Industry Company product, Product name: DPD-100S). The wafers on which the resist patterns were formed were hard-baked at 140° C., 160° C. and 180° C. respectively for 300 seconds on a hot plate, and they were designated a-14, a-16 and a-18.

Preparation of Sample b

Using the resist pattern formed on the Samples a as a mask, a $CF_4/O_2$ gas mixture as etching gas, and using a dry etching apparatus (Applied Material Company product, Model name: P/500(single handling type)), the lower aluminum film that was not covered by the resist pattern was etched to form a metal wiring pattern. At this time, the process conditions were controlled such that organic metal film was not formed by the dry etching process. Then, only a part of the upper layer of the resist film was removed by an ashing process using an ashing apparatus (Dongkyung Chemical Industry Company product, Model name: TCA-2400) and an $O_2/N_2$ gas mixture as a reaction gas, and the samples were designated b-14, b-16 and b-18. The etching conditions for the dry etching process were as follows:

[Dry etching conditions]

Etching gas: $CF_4/O_2$ gas mixture

Gas flow rate: 200 sccm

Pressure: 20 m Torr
RF Power: 400 W
Magnetic field: 140 Gauss
Stage temperature: 20° C.
Etching time: 300 seconds
[Ashing Conditions]
Reaction gas: $O_2/N_2$ gas mixture=950/50 sccm
Pressure: 5 m Torr
Microwave Power: 1 Kw
Wafer temperature: 200° C.
Ashing time: 120 seconds/wafer
Preparation of Sample c $As^+$ dopant was ion-injected on the front side of the Samples a at a radiation dose of $1\times10^{16}$ ions/cm$^2$ and an acceleration energy of 80 KeV. The ion injection angle was set to 0° so as to conduct the ion-injection perpendicular to a substrate side. The samples were moved to a downstream mode microwave ashing apparatus (Dongkyung Chemical Industry Company product, Model name: TCA-2400), and only a part of the upper layer of the resist film was removed through an ashing process using an $O_2/N_2$ gas mixture as a reaction gas, and the samples were designated c-14, c-16 and c-18.

[Ashing conditions]
Reaction gas: $O_2/N_2$ gas mixture=950/50 sccm
Pressure: 5 mTorr
Microwave Power: 1 Kw
Wafer temperature: 200° C.
Ashing time: 120 sec/wafer
Resist Removal Test The Samples a, b and c were respectively immersed in a resist remover composition at 25° C. and 50° C. for 3 minutes. The samples were taken out of the resist remover composition, and then, they were washed with pure water and dried with nitrogen gas. They were examined to determine whether or not resist residues were deposited on the surface of a line pattern and around a via-hole pattern, using a SEM. The resist removal performance was evaluated on the basis of the following standards and the results are presented in Tables 3 and 4.

○: Resist residues were completely removed around via-hole pattern and the surface of line pattern.

Δ: 80% or more of resist residues were removed around via-hole pattern and the surface of line pattern, but small amount thereof remained.

X: Most of resist residues were not removed around via-hole pattern and the surface of line pattern.

(2) Metal Wiring Corrosion Test
Preparation of Sample d-12

On the surface of 5-inch silicon wafers on which 1 10,000 Å aluminum film was formed, a commonly used positive resist composition (Mitsubishi Company product, Product name: IS401) was spin-coated such that the final film thickness reached 1.6 μm.

The resist film was pre-baked on a hot plate at 100° C. for 90 seconds. A mask having a predetermined pattern was placed on the resist film, ultraviolet rays were irradiated thereto and the resist film was developed using 2.38% tetramethylammonium hydroxide (TMAH) developer (Dongjin Chemical Industry Company product, Product name: DPD-1002) at 21° C. for 60 seconds.

The wafer on which the resist pattern was formed was hard-baked on a hot plate at 120° C. for 300 seconds.

Using the thus formed resist pattern as a mask and $CF_4/O_2$ gas mixture as an etching gas, an aluminum film which was not covered by the resist pattern was etched in a dry etching apparatus (Applied Material Company product, Model name: P/5000) to form a metal wiring pattern. At this time, process conditions were controlled so as to not generate organic metal film during the dry etching process. Only a part of the upper layer of the resist film was removed through an ashing process using an $O_2/N_2$ gas mixture as a reaction gas in an ashing apparatus (Donkyung Chemical Industry Company, Model name: TCA-2400), and the sample was designated d-12.

Metal Wiring Corrosion Test

The Samples d-12 were immersed in a resist remover composition for 10 minutes, 2 hours and 24 hours respectively while maintaining a temperature of 50° C. The samples were taken out of the resist remover composition, and then they were washed with pure water and dried with nitrogen gas. Then, the upper and side surfaces of the aluminum pattern line were examined using a SEM, and the degree of corrosion was evaluated on the basis of the following standards. The results are presented in Table 5.

⊚: No corrosion on the side or upper surface of aluminum pattern line

○: Only a part of the side surface of aluminum pattern line was corroded.

Δ: Parts of the side and upper surfaces of aluminum pattern line were corroded.

X: The side or upper surface of aluminum pattern was seriously corroded.

(3) Metal Ion Eruption Test

20 Samples d-12 were immersed respectively in a 2 kg resist remover composition while maintaining a temperature of 50° C. The resist remover composition was sampled when 12 hours, 24 hours and 48 hours had elapsed. The amounts of aluminum ions that had erupted from the lower aluminum wiring pattern of the Sample d-12 were measured using an ICP-MS apparatus (Inductively Coupled Plasma-Mass Spectroscopy, PERKIN-ELMER Company product, Model name: ELAN 6000) equipped with an ETV (Electro Thermal Vaporizer). The results are presented in ppb in Table 6.

(4) Resist Redeposit Test 20 kg of the resist remover compositions of Example 7 and Comparative Example 3 were tested for their resist removal capabilities while increasing the treated sheet number of the Samples b-14 and c-14 to from 1 to 100, 200, 300 and 400 sheets, while maintaining the temperature at 50° C. During the test, the amount of resist that was redeposited on a substrate was examined. When the treated sheet numbers were respectively 1, 100, 200, 300 and 400, the substrate was sampled, rinsed with pure water and dried with nitrogen gas. Then, the numbers of microparticles of resist residues redeposited on the substrate were measured using a surface inspection apparatus (Japan Canon Company product, Model name: WIS-850). The results are presented in Table 7.

EXAMPLES 1 TO 11 AND COMPARATIVE EXAMPLES 1 TO 7

The ingredients a) to d) of the composition of the present invention were mixed in a ratio as described in Table 2 to prepare the resist remover compositions of Examples 1 to 11 and Comparative Examples 1 to 7. The thus obtained resist remover compositions were tested for (1) their resist removal performance, (2) metal wiring corrosion, (3) metal ion eruption, and (4) resist redeposition. The results are presented in Tables 3 to 7.

TABLE 2

The compositional ratios of resist remover compositions

| | | a) Organic Amine Compound | | b) Polar Organic Solvent | | c) Water | d) Organic Phenol Compound (having 2 or more of OH groups) | | e) Hydroxyl Amine |
|---|---|---|---|---|---|---|---|---|---|
| | | Type | Content | Type | Content | Content | Type | Content | Content |
| Examples | 1 | MIPA | 15 | NMP | 45 | 32.0 | Formula 7 | 8 | — |
| | 2 | MIPA | 17 | DMF | 50 | 29.5 | Formula 8 | 3.5 | — |
| | 3 | MIPA | 25 | HBM | 49.5 | 23.0 | Catechol | 2.5 | — |
| | 4 | MEA | 21 | NMP | 47 | 30.0 | Formula 9 | 2 | — |
| | 5 | MEA | 35 | DMI | 30 | 30.0 | Formula 10 | 5 | — |
| | 6 | MEA | 30 | NMP | 50 | 18.0 | Formula 11 | 2 | — |
| | 7 | MEA | 40 | NMP | 30 | 25.0 | Catechol | 5 | — |
| | 8 | MEA | 40 | HBM | 30 | 26.0 | Formula 12 | 4 | — |
| | 9 | MEA | 30 | HBM | 47 | 21.0 | Catechol | 2 | — |
| | 10 | MEA | 30 | HBM + MMP | 30 + 10 | 28.0 | Catechol | 2 | — |
| | 11 | MEA | 32 | HBM + MMP | 31 + 11 | 24.0 | Catechol | 2 | — |
| Comparative Examples | 1 | MEA | 10 | MFDG | 22 | 48 | — | — | 20 |
| | 2 | MEA | 15 | EC | 30 | 30 | — | — | 25 |
| | 3 | MEA | 3 | DMAc | 97.0 | — | — | — | — |
| | 4 | AEE | 70 | MF | 20 | 8 | m-C | 2 | — |
| | 5 | MEA | 60 | BC | 35 | 5 | — | — | — |
| | 6 | MEA | 60 | BC | 30 | 10 | — | — | — |
| | 7 | MEA | 40 | EC | 30 | 26 | SA | 4 | — |

MIPA: Monoisopropanolamine
MEA: Monoethanolamine
AEE: Aminoethoxy ethanol
HBM: 2-hydroxyisobutyric acid methylester
DMF: dimethylformamide
NMP: N-methylpyrrolidone
DMI: dimethylimidazolidinone
DMAc: dimethylacetamide
MFDG: dipropyleneglycolmonoethylether
EC: Ethyl carbitol
BC: Butyl carbitol
MF: Methyl formamide
PEG: Polyethylenegylcol
m-C: m-Cresol
SA: Salycylic aldehyde

[Formula 7]

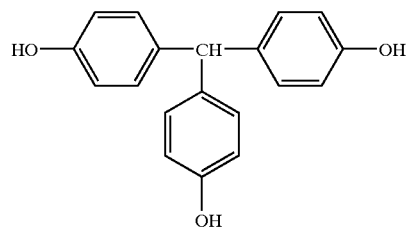

[Formula 8]

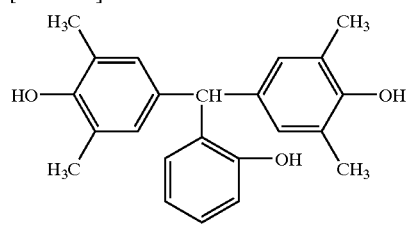

TABLE 2-continued
The compositional ratios of resist remover compositions
| | Compositional Ratios of Resist Remover Composition (wt %) | | | | |
|---|---|---|---|---|---|
| a) Organic Amine Compound | | b) Polar Organic Solvent | | c) Water | d) Organic Phenol Compound (having 2 or more of OH groups) | e) Hydroxyl Amine |
| Type | Content | Type | Content | Content | Type | Content | Content |
[Formula 9]
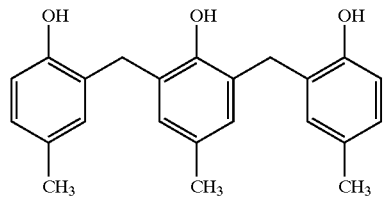
[Formula 10]
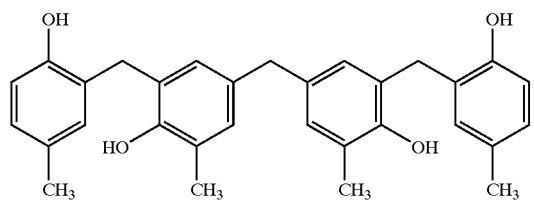
[Formula 11]
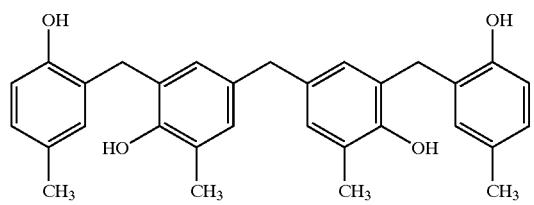
[Formula 12]
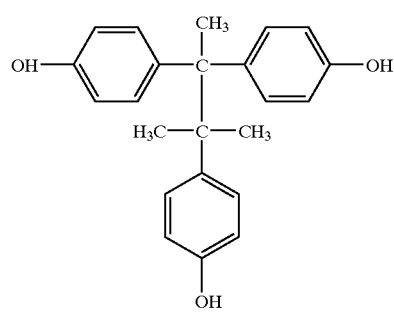

TABLE 3

Resist removal performance at a resist remover composition temperature of 25° C.

Temperature of Remover Composition 25° C.
Sample (Hard-baking Temperature)

| | a-14 | a-16 | a-18 | b-14 | b-16 | b-18 | c-14 | c-16 | c-18 |
|---|---|---|---|---|---|---|---|---|---|
| Example | | | | | | | | | |
| 1 | ○ | ○ | ○ | ○ | ○ | Δ | ○ | ○ | Δ |
| 2 | ○ | ○ | Δ | ○ | ○ | Δ | ○ | ○ | Δ |
| 3 | ○ | ○ | ○ | ○ | ○ | ○ | ○ | ○ | ○ |
| 4 | ○ | ○ | Δ | ○ | Δ | ○ | ○ | ○ | Δ |
| 5 | ○ | ○ | ○ | ○ | Δ | Δ | Δ | ○ | ○ |
| 6 | ○ | ○ | ○ | ○ | ○ | Δ | ○ | Δ | Δ |
| 7 | ○ | ○ | ○ | Δ | ○ | ○ | Δ | ○ | ○ |
| 8 | ○ | ○ | ○ | ○ | ○ | ○ | ○ | ○ | ○ |
| 9 | ○ | ○ | ○ | ○ | ○ | ○ | ○ | ○ | ○ |
| 10 | ○ | ○ | ○ | ○ | ○ | ○ | ○ | ○ | ○ |
| 11 | ○ | ○ | ○ | ○ | ○ | ○ | ○ | ○ | ○ |
| Comparative Example | | | | | | | | | |
| 1 | Δ | X | X | Δ | X | X | Δ | X | X |
| 2 | ○ | Δ | X | ○ | Δ | Δ | ○ | Δ | X |
| 3 | Δ | X | X | X | X | X | X | X | X |
| 4 | Δ | X | X | X | X | X | Δ | X | X |
| 5 | ○ | Δ | X | X | X | X | X | X | X |
| 6 | ○ | Δ | X | ○ | X | X | Δ | X | X |
| 7 | ○ | X | X | Δ | X | X | Δ | Δ | X |

TABLE 4

Resist removal performance at a resist remover composition temperature of 50° C.

Temperature of Remover Composition 50° C.
Sample (Hard-baking Temperature)

| | a-14 | a-16 | a-18 | b-14 | b-16 | b-18 | c-14 | c-16 | c-18 |
|---|---|---|---|---|---|---|---|---|---|
| Example | | | | | | | | | |
| 1 | ○ | ○ | ○ | Δ | ○ | ○ | Δ | ○ | ○ |
| 2 | ○ | ○ | Δ | ○ | ○ | ○ | ○ | ○ | ○ |
| 3 | ○ | ○ | ○ | ○ | ○ | ○ | ○ | ○ | ○ |
| 4 | ○ | ○ | Δ | ○ | ○ | ○ | ○ | ○ | ○ |
| 5 | ○ | ○ | ○ | Δ | Δ | ○ | ○ | ○ | ○ |
| 6 | ○ | ○ | ○ | ○ | ○ | Δ | ○ | Δ | Δ |
| 7 | ○ | ○ | ○ | Δ | ○ | ○ | Δ | Δ | ○ |
| 8 | ○ | ○ | ○ | ○ | ○ | ○ | ○ | ○ | ○ |
| 9 | ○ | ○ | ○ | ○ | ○ | ○ | ○ | ○ | ○ |
| 10 | ○ | ○ | ○ | ○ | ○ | ○ | ○ | ○ | ○ |
| 11 | ○ | ○ | ○ | ○ | ○ | ○ | ○ | ○ | ○ |
| Comparative Example | | | | | | | | | |
| 1 | Δ | X | X | Δ | X | X | Δ | X | X |
| 2 | ○ | Δ | Δ | ○ | ○ | Δ | ○ | Δ | Δ |
| 3 | Δ | Δ | X | Δ | X | X | Δ | X | X |
| 4 | Δ | X | X | X | X | X | Δ | X | X |
| 5 | ○ | ○ | Δ | X | X | X | X | X | X |
| 6 | ○ | Δ | X | ○ | X | X | Δ | X | X |
| 7 | ○ | Δ | Δ | ○ | X | X | Δ | X | X |

Referring to Tables 3 and 4, it can be seen that the resist remover composition according to the present invention (Examples 1 to 11) can effectively remove resist films that have been cured and modified by a hard-bake process, a dry etching process, an ion implantation process and/or an ashing process even at a low temperature (25, 50° C.).

Although the resist remover compositions of the Comparative Examples can comparatively effectively remove resist films that were not exposed to a dry etching process, an ion implantation process and/or an ashing process (Samples a-14, a-16, a-18) even at a low temperature, the resist removal performance decreased as the hard-bake temperature increased, and the resist removal performance for resist films that have been cured and modified by the dry etching process, the ion implantation process and/or the ashing process (Samples b-14 to c-18) were poor.

Detailed examination of Tables 3 and 4 reveals that the resist remover composition of Comparative Example 3 which does not contain an organic phenol compound containing two or more hydroxyl groups and water showed the poorest resist removal performance for cured and modified resist film.

In addition, the composition of Comparative Example 4 which contained water but contained a comparatively excessive amount of water-soluble organic amine compound showed poor resist removal performance for cured and modified resist film. It can be seen that the compositions of the Comparative Examples which did not contain an organic phenol compound containing two or more hydroxyl groups, or which contained an organic phenol compound having one hydroxyl group showed poor resist removal performance for cured and modified resist films at low temperature. From the Tables 3 and 4, it can be confirmed that the component that is the most influential in the removal of cured and modified resist film is the organic phenol compound containing two or more hydroxyl groups, and it can be seen that the compositions of Examples 3, 8 and 9 which contained HBM as an organic polar solvent and those of Examples 10 and 11 which contained HBM+MMP showed better resist removal performance than those containing other organic solvents.

TABLE 5

Metal wiring corrosion test

Temperature of Remover Composition 50° C.

| Immersion Time | | 10 minutes | 2 hours | 24 hours |
|---|---|---|---|---|
| Examples | 1 | ⊙ | ○ | Δ |
| | 2 | ⊙ | ○ | Δ |
| | 3 | ⊙ | ⊙ | ⊙ |
| | 4 | ⊙ | ○ | Δ |
| | 5 | ⊙ | ○ | Δ |
| | 6 | ⊙ | ⊙ | ○ |
| | 7 | ⊙ | ⊙ | ○ |
| | 8 | ⊙ | ⊙ | ⊙ |
| | 9 | ⊙ | ⊙ | ○ |
| | 10 | ⊙ | ⊙ | ⊙ |
| | 11 | ⊙ | ⊙ | ⊙ |
| Comparative Examples | 1 | Δ | X | X |
| | 2 | ○ | Δ | Δ |
| | 3 | Δ | X | X |
| | 4 | Δ | X | X |
| | 5 | Δ | X | X |
| | 6 | ○ | Δ | X |
| | 7 | Δ | X | X |

Referring to Table 5, it can be seen that in the resist remover composition according to the present invention (Examples 1 to 11), the organic phenol compound containing two or more hydroxyl groups which exhibits anti-corrosion effects hardly corroded the lower metal wiring pattern until 2 hours after immersion, and the compositions of Examples 3, 8 and 9 using HBM as the organic polar solvent and those of Examples 10 and 11 using HBM+MMP did not corrode the metal wiring pattern even after 2 hours or more had elapsed. However, those of Comparative Examples 1 to 7 began to corrode the lower metal wiring pattern when 10 minutes had elapsed after immersion, and it seriously corroded a part of the lower metal wiring pattern after two hours. Accordingly, if the remover composition of the Comparative Examples is used to conduct the resist removal process, a concerned exists that metal wiring of the semiconductor devices will be cut, causing a decrease in production yield, while the remover composition of the present invention is expected to decrease such risk.

More detailed examination of Table 5 reveals that the composition of Comparative Examples 3, 5 and 7 which did not contain an organic phenol compound having two or more hydroxyl groups caused serious corrosion of the upper and side surfaces of the lower metal wiring pattern to seriously impair pattern width.

In addition, the composition of Comparative Example 1 having a comparatively high water content as an anti-corrosive also caused serious corrosion of the lower metal wiring pattern.

TABLE 6

Metal ion eruption test (in ppb)

Temperature of Remover Composition 50° C.
Immersion Time

| | 0 hours | 12 hours | 24 hours | 48 hours |
|---|---|---|---|---|
| Examples | | | | |
| 1 | 1 | 3 | 19 | 35 |
| 2 | 1 | 3 | 17 | 36 |
| 3 | 1 | 2 | 13 | 29 |
| 4 | 2 | 3 | 19 | 37 |
| 5 | 1 | 4 | 21 | 41 |
| 6 | 1 | 3 | 16 | 32 |
| 7 | 2 | 3 | 15 | 34 |
| 8 | 1 | 5 | 14 | 31 |
| 9 | 1 | 1 | 15 | 30 |
| 10 | 1 | 3 | 13 | 30 |
| 11 | 1 | 2 | 12 | 29 |
| Comparative Examples | | | | |
| 1 | 1 | 35 | 69 | 145 |
| 2 | 1 | 19 | 42 | 210 |
| 3 | 2 | 24 | 39 | 109 |
| 4 | 1 | 25 | 45 | 167 |
| 5 | 1 | 42 | 63 | 231 |
| 6 | 2 | 28 | 45 | 114 |
| 7 | 2 | 31 | 48 | 121 |

Referring to Table 6, it can seen that the resist remover compositions of the present invention (Examples 1 to 11) showed little change in the amount of aluminum ion eruption until 12 hours had elapsed, indicating they caused little corrosion of the lower metal wiring pattern. On the other hand, the compositions of Comparative Examples 1 to 7 showed increases in the amount of aluminum ion eruption by about 10 times on average of those of the Examples after 12 hours had elapsed, indicating they caused serious corrosion of the lower metal wiring pattern.

These results are due to the fact that the compositions of Examples 1 to 11 have excellent anti-corrosiveness because they contain d) organic phenol compounds having two or more hydroxyl groups which functions as an anti-corrosive, while the compositions of Comparative Examples 1 to 7 do not.

TABLE 7

Resist redeposit test

| | Sample b-14 | | Sample c-14 | |
|---|---|---|---|---|
| Treated Sheet Number | Example 10 | Comparative Example 3 | Example 10 | Comparative Example 3 |
| 1 | 0 | 0 | 0 | 0 |
| 100 | 2 | 14 | 1 | 18 |
| 200 | 3 | 37 | 3 | 40 |
| 300 | 6 | 71 | 6 | 69 |
| 400 | 9 | 138 | 10 | 140 |

Referring to Table 7, it can be seen that the composition of Comparative Example 3 had about 10 times the number of resist residue micro-particles than those of the composition of Example 10, for 100 to 400 treated sheets.

As the above shows, the resist remover composition according to the present invention can easily and quickly remove resist films that have been cured by dry etching, ashing and ion implantation processes and those modified by metallic side-products etched from lower metal film materials during said processes. It can also minimize the corrosion of lower metal wiring, particularly side pitting, and decrease the phenomenon in which resists that have been dissolved in resist remover are extracted to redeposit on the surface of a substrate even with a prolonged use. In addition, it can be rinsed with water without a need to use organic solvents such as isopropyl alcohol and dimethylsulfoxide during a subsequent rinsing process.

What is claimed is:

1. A resist remover composition comprising a) 10 to 40 wt % of water-soluble organic amine compound, b) 10 to 60 wt % of water-soluble polar organic solvent, c) 10 to 30 wt % of water, and d) 0.1 to 10 wt % of organic phenol compound containing two or more hydroxyl groups, characterized in that the water-soluble polar organic solvent is 2-hydroxyisobutyric acid methylester (HBM).

2. The resist remover composition according to claim 1, wherein the water-soluble organic amine compound is amino alcohol.

3. The resist remover composition according to claim 2, wherein the amino alcohol is selected from a group consisting of 2-amino-1-ethanol, 1-amino-2-propanol, 2-amino-1-propanol, 3-amino-1-propanol, 2-amino-1-butanol, 4-amino-1-butanol and a mixture thereof.

4. The resist remover composition according to claim 1, wherein the water-soluble polar organic solvent is selected from a group consisting of dimethylsulfoxide (DMSO), N-methylpyrrolidone (NMP), dimethylacetamide (DMAc), dimethylformamide (DMF), dimethylimidazolidinone (DMI), aliphatic carboxylic acid ester and a mixture thereof.

5. The resist remover composition according to claim 4, wherein the aliphatic carboxylic acid ester is selected from a group consisting of β-methoxy isobutyric acid methyl ester (MBM), 2-hydroxypropionic acid isopentyl ester, 2-hydroxypropionic acid butyl ester, ethyl-3-ethoxypropionate (EEP), methyl-3-methoxypropionate (MMP), ethyl-2-hydroxy propanate, butyl-2-hydroxy propanoate and a mixture thereof.

* * * * *